US012808936B2

(12) United States Patent
Wu et al.

(10) Patent No.: US 12,808,936 B2
(45) Date of Patent: Nov. 24, 2026

(54) METHOD AND DEVICE FOR BATTERY DETECTION

(71) Applicant: Industrial Technology Research Institute, Hsinchu (TW)

(72) Inventors: Teng-Chun Wu, Kinmen County (TW); Yean-San Long, Hsinchu City (TW); Cho-Fan Hsieh, Yilan County (TW); Min-An Tsai, Yunlin County (TW); Hsiu-Ming Chang, New Taipei City (TW); Feng-Ming Chuang, New Taipei City (TW); Tze-An Liu, Hsinchu City (TW)

(73) Assignee: Industrial Technology Research Institute, Hsinchu (TW)

( * ) Notice: Subject to any disclaimer, the term of this patent is extended or adjusted under 35 U.S.C. 154(b) by 536 days.

(21) Appl. No.: 18/152,771

(22) Filed: Jan. 11, 2023

(65) Prior Publication Data

US 2023/0333168 A1 Oct. 19, 2023

Related U.S. Application Data

(60) Provisional application No. 63/331,260, filed on Apr. 15, 2022.

(30) Foreign Application Priority Data

Oct. 3, 2022 (TW) ................................. 111137594

(51) Int. Cl.
*G01R 31/367* (2019.01)

(52) U.S. Cl.
CPC ................................. *G01R 31/367* (2019.01)

(58) Field of Classification Search
None
See application file for complete search history.

(56) References Cited

U.S. PATENT DOCUMENTS 5,923,148 A 7/1999 Sideris et al.
10,976,374 B2 * 4/2021 Kodama ............ H01M 50/253
(Continued)

FOREIGN PATENT DOCUMENTS

CN 1848515 10/2006
CN 101814627 8/2010
(Continued)

OTHER PUBLICATIONS

"Office Action of Taiwan Counterpart Application", issued on Jun. 6, 2023, p. 1-p. 4.
(Continued)

*Primary Examiner* — Raymond L Nimox
(74) *Attorney, Agent, or Firm* — JCIPRNET

(57) ABSTRACT

A method and a device for battery detection are provided. In the method, multiple characteristic values measured from a battery during operation of the battery are captured via a data capturing device to form a characteristic curve. Curve fitting is performed on the characteristic curve to obtain a curve error. According to the magnitude of the curve error, it is determined whether the battery is normal. When the determination result is abnormal, a step-curvature radius analysis is performed on the characteristic curve to determine whether the battery is normal.

16 Claims, 4 Drawing Sheets

(56) References Cited

U.S. PATENT DOCUMENTS

| | | | | |
|---|---|---|---|---|
| 2010/0013489 | A1 | 1/2010 | Vonderhaar et al. | |
| 2019/0173423 | A1 | 6/2019 | Long et al. | |
| 2019/0331738 | A1 | 10/2019 | Kodama | |
| 2021/0316636 | A1* | 10/2021 | Gelso | G05B 17/02 |

FOREIGN PATENT DOCUMENTS

| | | |
|---|---|---|
| CN | 101916885 | 12/2010 |
| CN | 113064077 | 7/2021 |
| CN | 113671386 | 11/2021 |
| EP | 2302725 | 3/2011 |
| EP | 2306557 | 4/2011 |
| JP | 2007328943 | 12/2007 |
| JP | 2011033700 | 2/2011 |
| JP | 2011033781 | 2/2011 |
| KR | 20100024708 | 3/2010 |
| TW | 201505357 | 2/2015 |
| TW | 202142886 | 11/2021 |

OTHER PUBLICATIONS

TC 9—Electrical equipment and systems for railways, "Railway applications—Rolling stock equipment—Capacitors for power electronics—Part 3: Electric double-layer capacitors", IEC 61881-3, Aug. 8, 2012, pp. 1-64.

Yuanxing Zhang et al., "Electric Vehicle Charging Fault Monitoring and Warning Method Based on Battery Model", World Electric Vehicle Journal, Jan. 14, 2021, pp. 1-15.

Byunggyu Yu, "Design and Experimental Results of Battery Charging System for Microgrid System", International Journal of Photoenergy, vol. 2016, Oct. 27, 2016, pp. 1-7.

"Office Action of China Counterpart Application", issued on Jul. 15, 2026, p. 1-p. 8.

* cited by examiner

METHOD AND DEVICE FOR BATTERY DETECTION

CROSS-REFERENCE TO RELATED APPLICATION

This application claims the priority benefit of US provisional application Ser. No. 63/331,260, filed on Apr. 15, 2022, and Taiwan application serial no. 111137594, filed on Oct. 3, 2022. The entirety of each of the above-mentioned patent applications is hereby incorporated by reference herein and made a part of this specification.

BACKGROUND

Technical Field

The disclosure relates to a method and a device for battery detection.

Description of Related Art

With the increase in the installed capacity of the renewable energy, the global energy storage market is growing rapidly. However, due to a defect of the battery system, an inadequate protection system to deal with the electrical fault, an insufficient management of the operating environment, and a lack of an integrated management system for the energy storage system, many accidents have occurred in the energy storage system.

The existing battery management system, for example, takes the electrical properties of the known healthy battery as the target and monitors the abnormality of the battery by monitoring parameters such as voltage/current/temperature for a long duration of time. Such monitoring method requires time to build an electrical database of the healthy battery and must be combined with long-term monitoring to determine the abnormality, so is time-consuming as a whole.

SUMMARY

The disclosure provides a method and a device for battery detection, which may increase the accuracy of battery detection and determine whether the battery is normal or abnormal.

An embodiment of the disclosure provides a method for battery detection, which is adapted to an electronic device including a data capturing device and a processor. The method includes the following: capturing multiple characteristic values measured from a battery during operation of the battery via the data capturing device data to form a characteristic curve; performing curve fitting on the characteristic curve to obtain a curve error; determining whether the battery is normal according to the magnitude of the curve error; and performing a step-curvature radius analysis on the characteristic curve to determine whether the battery is normal when the determination result is abnormal.

An embodiment of the disclosure provides a device for battery detection, which includes a data capturing device and a processor. The processor is coupled to the data capturing device. The processor is configured to capture multiple characteristic values measured from a battery during operation of the battery via the data capturing device to form a characteristic curve. Curve fitting is performed on the characteristic curve to obtain a curve error. According to the magnitude of the curve error, it is determined whether the battery is normal. When the determination result is abnormal, a step-curvature radius analysis is performed on the characteristic curve to determine whether the battery is normal.

Based on the above, in the method and the device for battery detection of the disclosure, through combining curve fitting, polynomial fitting, peak fitting, step-curvature radius analysis, and other technologies, the error may be calculated for different segments in the charging or discharging curve of the battery to detect the surge wave, which is effective in detecting the battery abnormality and determining the type of the abnormality.

In order to make the above-mentioned features and advantages of the disclosure easier to understand, the following embodiments are given and described in details with the accompanying drawings as follows.

DESCRIPTION OF THE EMBODIMENTS

The embodiment of the disclosure is based on the measurement framework of the existing energy storage battery and proposes a device and a method for battery detection. Through curve fitting, polynomial fitting, peak fitting, and other technologies, the battery abnormality may be effectively detected according to the charging or discharging curve of the battery.

Figure 1:
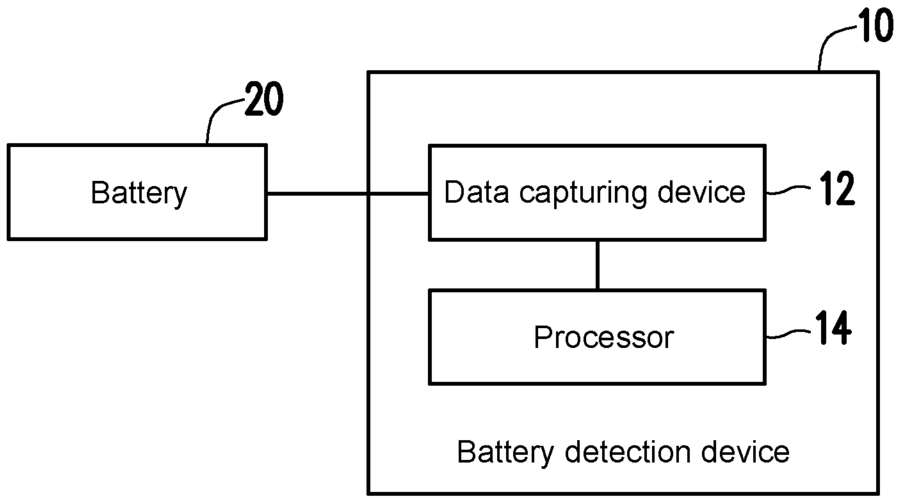
FIG. 1 is a block diagram of a device for battery detection according to an embodiment of the disclosure.

FIG. 1 is a block diagram of a device for battery detection according to an embodiment of the disclosure. Please refer to FIG. 1. A battery detection device 10 of the present embodiment is, for example, a personal computer, a server, a workstation, or other electronic devices with a computing function. The battery detection device 10 includes a data capturing device 12 and a processor 14 and the function therein are described as follows.

The data capturing device 12 may be, for example, a universal serial bus (USB), a RS232, a universal asynchronous receiver/transmitter (UART), an internal integrated circuit (I2C), a serial peripheral interface (SPI), a display port, a thunderbolt, a wired connection device such as a local area network (LAN) interface, a wireless fidelity (Wi-Fi)), a RFID, a bluetooth, an infrared, a near-field communication (NFC), or a device-to-device (D2D) communication protocol wireless connection device, and there is no limitation here. The data capturing device 12 may be connected to a local or remote battery 20 or a sensor (such as a voltmeter, a current meter, a resistance meter, a thermometer, etc.) disposed on the battery 20 to capture the characteristic values of the battery during operation, such as the voltage value, the current value, the resistance value, or the temperature value, and there is no limitation here. In some embodiments, when the battery 20 is detected, for example, the battery 20 is placed in a closed chamber, with environmental parameters such as temperature, humidity, and pressure in the chamber maintained, so as to detect the characteristic value of the battery 20 under a specific environment during operation.

The processor 14 is coupled to the data capturing device 12 for controlling the operation of the efficient battery detection device 10. In some embodiments, the processor 14 may be, for example, a central processing unit (CPU), other programmable general-purpose or special-purpose microprocessors, a digital signal processor (DSP), a programmable controller, an application specific integrated circuit (ASIC), a field programmable gate array (FPGA), a programmable logic controller (PLC), or other similar devices or a combination of the aforementioned devices. The processor 14 may load and execute the computer program stored in the hardware or the memory, so as to execute the method for battery detection of the embodiment of the disclosure.

Figure 2:
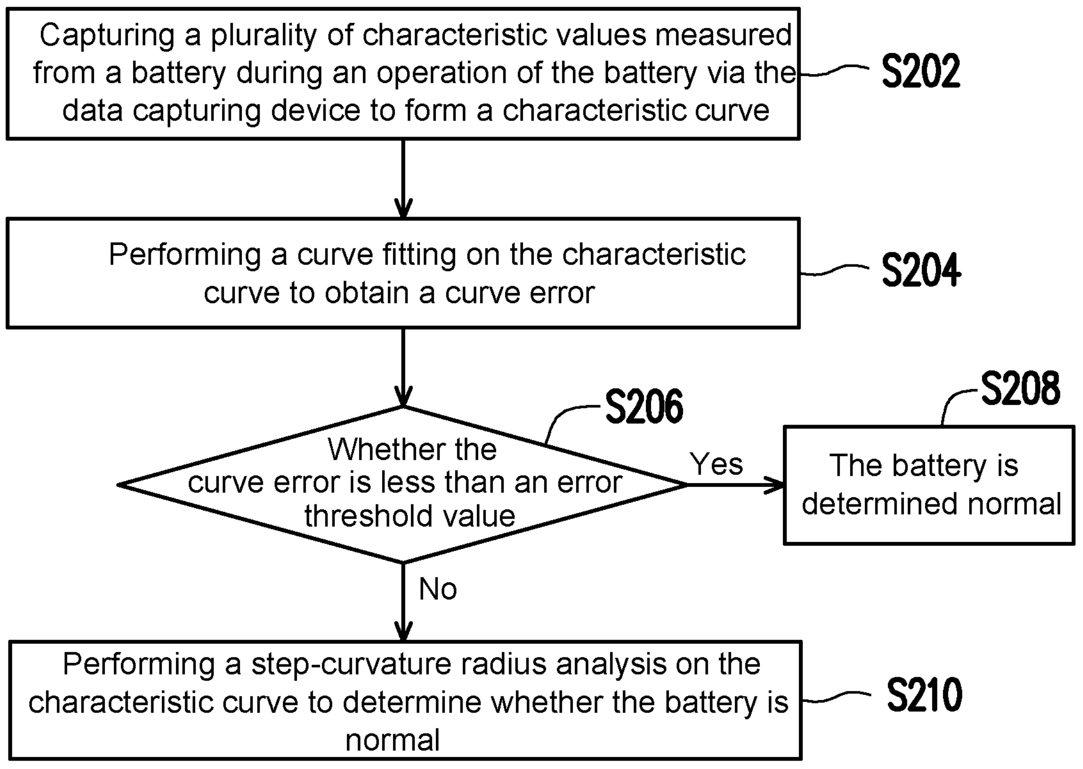
FIG. 2 is a flow diagram of a method for battery detection according to an embodiment of the disclosure.

FIG. 2 is a flow diagram of a method for battery detection according to an embodiment of the disclosure. Please refer to FIG. 1 and FIG. 2 at the same time. The method of the embodiment is adapted to the battery detection device 10 of FIG. 1. The detailed steps of the method for battery detection of the embodiment of the disclosure are described below with reference to various components of the battery detection device 10.

In step S202, the processor 14 of the battery detection device 10 captures multiple characteristic values measured from the battery 20 during operation of the battery 20 via the data capturing device 12 to form a characteristic curve. The aforementioned operation period is, for example, the charging period or the discharging period of the battery. The characteristic values captured from the battery 20 may include electrical parameters such as the voltage value, the current value, and the resistance value, or the environmental parameters such as the temperature value and the pressure value. For example, the processor 14 may capture the open-circuit voltage when the battery 20 is charging or the short-circuit current when the battery 20 is discharging, and there is no limitation here. The processor 14 may form the characteristic curve respectively with the captured characteristic values to analyze the state of the battery 20.

In step S204, the processor 14 performs curve fitting on the characteristic curve to obtain a curve error. In step S206, according to the magnitude of the curve error, it is determined whether the battery 20 is normal. Specifically, the processor 14 may divide the characteristic curve into multiple segments to perform curve fitting. The error between the segments is then used as the curve error and is compared with a preset threshold value to determine whether the battery 20 is normal. The aforementioned threshold value is, for example, 1% of the average characteristic value of each segment curve, but is not limited hereto.

When the curve error is less than the threshold value, the process enters step S208. The processor 14 may determine that the battery 20 is normal. On the contrary, when the curve error is greater than or equal to the threshold value, the processor 14 preliminarily determines that the battery 20 is abnormal, and enters step S210 to further perform a step-curvature radius analysis on the characteristic curve to determine whether the battery 20 is normal.

Specifically, the processor 14 may divide the characteristic curve into multiple segments according to the step and find the characteristic value of the valid point in each segment to determine whether the characteristic values are centralized or discrete. When it is determined that the characteristic values are centralized, the processor 14 may further determine whether the battery is normal or abnormal according to the aggregated value error of the characteristic values, and determine the type of the battery abnormality according to the position of the segment in the characteristic curve where the aggregated value error is abnormal. On the contrary, when it is determined that the characteristic values are not centralized (i.e., discrete), the processor 14 may determine that the battery 20 is normal.

By performing a two-stage analysis of curve fitting and the step curvature radius analysis on the characteristic curve, the battery detection device 10 of the embodiment may effectively detect the abnormal battery 20.

Figure 3:
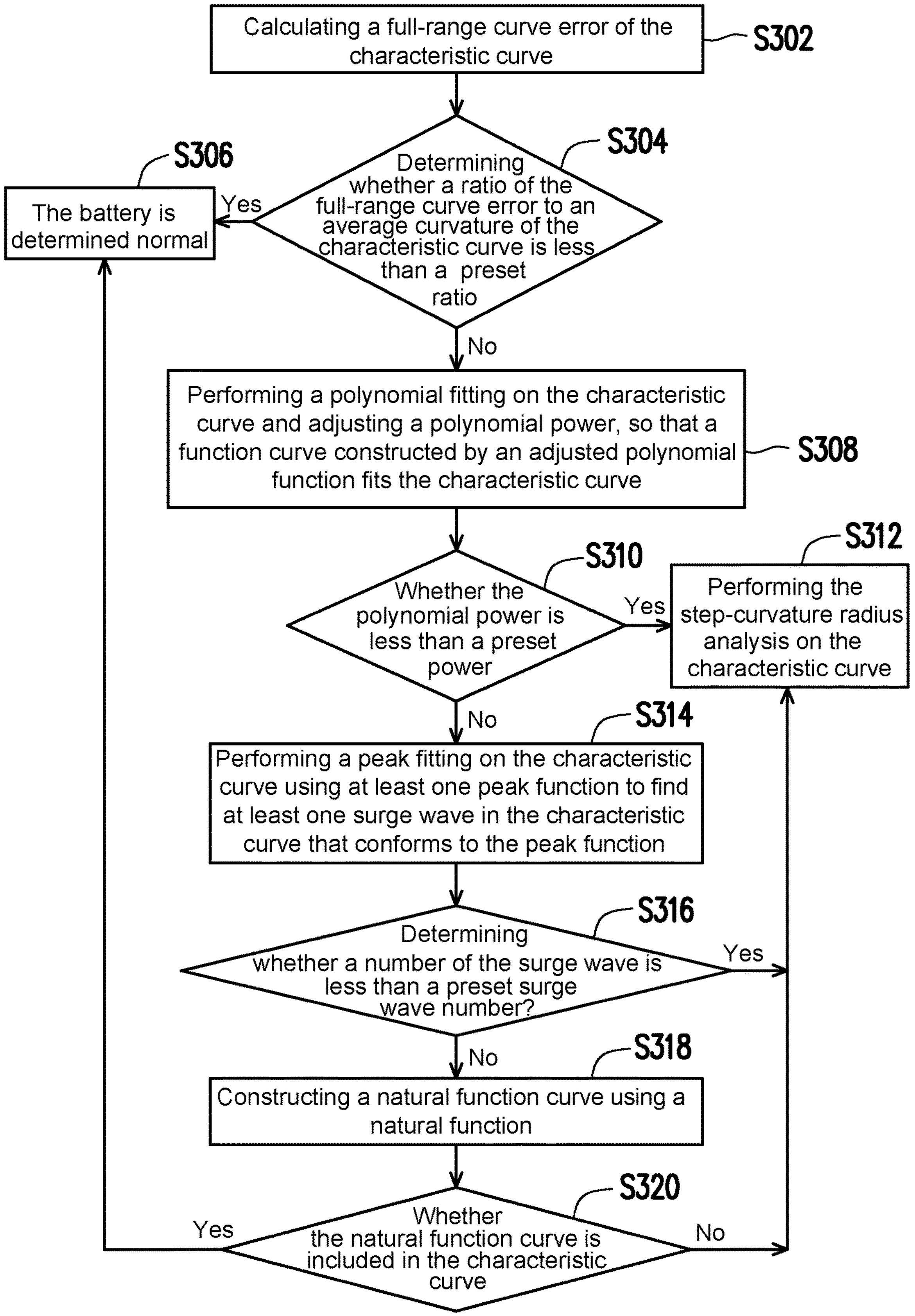
FIG. 3 is a flow diagram of a method of curve fitting according to an embodiment of the disclosure.

FIG. 3 is a flow diagram of a method of curve fitting according to an embodiment of the disclosure. Please refer to FIG. 1, FIG. 2 and FIG. 3 at the same time. The embodiment further illustrates the implementation of curve fitting described in step S204 of FIG. 2. The steps are as follows.

In step S302, the processor 14 calculates the full-range curve error of the characteristic curve. In step S304, the processor 14 determines whether the ratio of the full-range curve error to the average curvature of the characteristic curve is less than a preset ratio. Specifically, the processor 14 may divide the characteristic curve into multiple segments to perform curve fitting, calculate the error between the segments to serve as the curve error, and calculate the average of the curve error of the segments to serve as the full-range curve error. By dividing the full-range curve error by the average curvature of the characteristic curve and comparing the ratio with the preset ratio, it may be determined whether the battery 20 is normal. The aforementioned preset ratio is, for example, 1%, but is not limited hereto.

In step S304, when the ratio of the full-range curve error to the average curvature of the characteristic curve is less than the preset ratio, the process enters step S306. The processor 14 determines that the battery 20 is normal.

In step S304, when the ratio of the full-range curve error to the average curvature of the characteristic curve is not less than the preset ratio, the process enters step S308. The processor 14 performs polynomial fitting on the characteristic curve, and adjusts the polynomial power, so that the function curve constructed by the adjusted polynomial function fits the characteristic curve.

In detail, curve fitting refers to using a curve to approximate multiple discrete points (i.e., characteristic values) on the plane, while polynomial fitting is to derive a polynomial function, so that the function curve constructed by the polynomial function may optimally fit the characteristic values. By increasing the polynomial power, the function curve may fit the characteristic curve more accurately, but the computational complexity of the fitting operation is increased accordingly. In the case of discrete characteristic values, an accurate fitting result may not be obtained. Therefore, it is necessary to adjust the polynomial power as appropriate according to the error, so as to obtain a polynomial function that may optimally fit the characteristic curve.

In step S310, the processor 14 determines whether the polynomial power of the adjusted polynomial function is less than a preset power. When the polynomial power is less than the preset power, then in step S312, the processor 14 performs the step-curvature radius analysis on the characteristic curve.

In step S310, when the polynomial power is not less than the preset power, then in step S314, the processor 14 performs peak fitting on the characteristic curve using at least one peak function to find at least one surge wave in the characteristic curve that conforms to the peak function.

In step S316, the processor 14 determines whether the number of the surge wave found is less than a preset number of surge wave. The preset number of surge wave is, for example, 2 or a positive integer greater than 2, and there is no limitation here. When the number of surge wave is less than the preset number of surge wave, then in step S312, the processor 14 performs the step-curvature radius analysis on the characteristic curve.

When the number of the surge wave is not less than the preset number of surge wave, then in step S318, the processor 14 constructs a natural function curve using a natural function. In step S320, the processor 14 confirms whether the characteristic curve includes the natural function curve.

When the characteristic curve includes the natural function curve, the process enters step S306. The processor 14 determines that the battery 20 is normal. When the characteristic curve does not include the natural function curve, the process enters step S312. The processor 14 performs the step-curvature radius analysis on the characteristic curve.

By comprehensively analyzing the characteristic curve by means of the above-mentioned polynomial fitting, wave peak fitting, natural function fitting, etc., the battery detection device 10 of the embodiment may obtain a more accurate fitting result.

Figure 4:
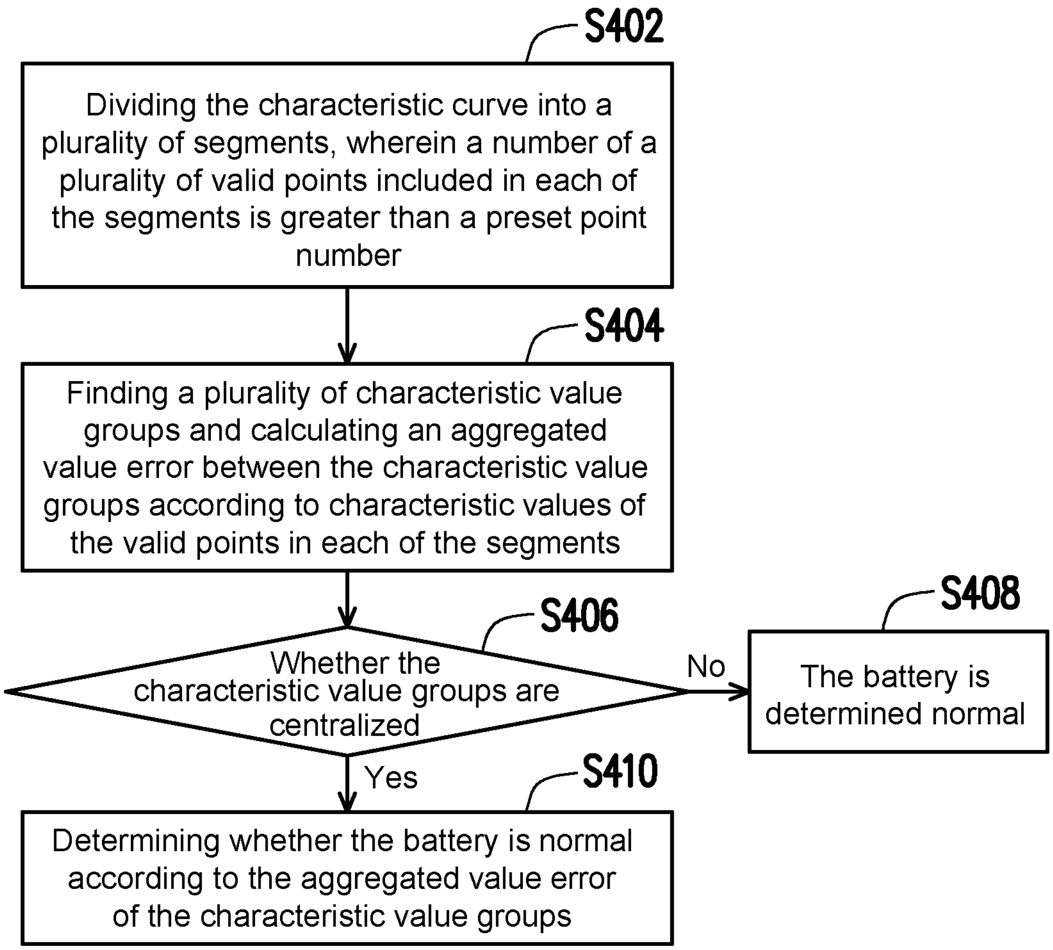
FIG. 4 is a flow diagram of a method of a step-curvature radius analysis according to an embodiment of the disclosure.

FIG. 4 is a flow diagram of a method of a step-curvature radius analysis according to an embodiment of the disclosure. Please refer to FIG. 1, FIG. 2 and FIG. 4 at the same time. The embodiment further illustrates the implementation of the step-curvature radius analysis described in step S210 of FIG. 2. The steps are as follows.

In step S402, the processor 14 divides the characteristic curve into multiple segments. The number of multiple valid points included in each segment is greater than the preset number (e.g., 5 or other positive integers).

In step S404, the processor 14 finds multiple characteristic value groups according to the characteristic value of each segment, and calculates the aggregated value error between the characteristic value groups. Taking a short-circuit current curve (Isc) as an example, the processor 14 may calculate the characteristic value of each segment of the short-circuit current curve (e.g., statistical values such as the mean and the standard deviation of the characteristic value), compare the characteristic value of the segments to find the multiple characteristic value groups, and calculate the aggregated value error between the characteristic value groups to determine whether the characteristic values are centralized or discrete.

In step S406, the processor 14 determines whether the characteristic value groups are centralized according to the aggregated value error between the characteristic value groups. Specifically, the processor 14, for example, compares the aggregated value error with a preset error. When the aggregated value error is less than the preset error, the processor 14 determines that the characteristic value groups are not centralized. In step S408, the processor 14 determines that the battery 20 is normal. The preset error is, for example, any value between 1% and 3%, and there is not limitation here.

In step S406, when the aggregated value error is not less than the preset error, the processor 14 determines that the characteristic value groups are centralized. In step S410, the processor 14 determines whether the battery is normal according to the aggregated value error of the characteristic value groups. The processor 14, for example, calculates a ratio of a sum of the aggregated value error of all segments of the characteristic curve to the average curvature of the characteristic curve, and compares the calculated ratio with a preset ratio. When the calculated ratio is greater than the preset ratio, the processor 14 determines that the battery 20 is normal. When the calculated ratio is not greater than the preset ratio, the processor 14 determines that the battery 20 is abnormal. The ratio is, for example, 2%, 5%, or other ratios, and there is no limitation here.

Through the method above, the battery detection device 10 of the embodiment may detect the surge wave from each segment of the characteristic curve, and more accurately detect whether the battery is normal or abnormal.

Figure 5:
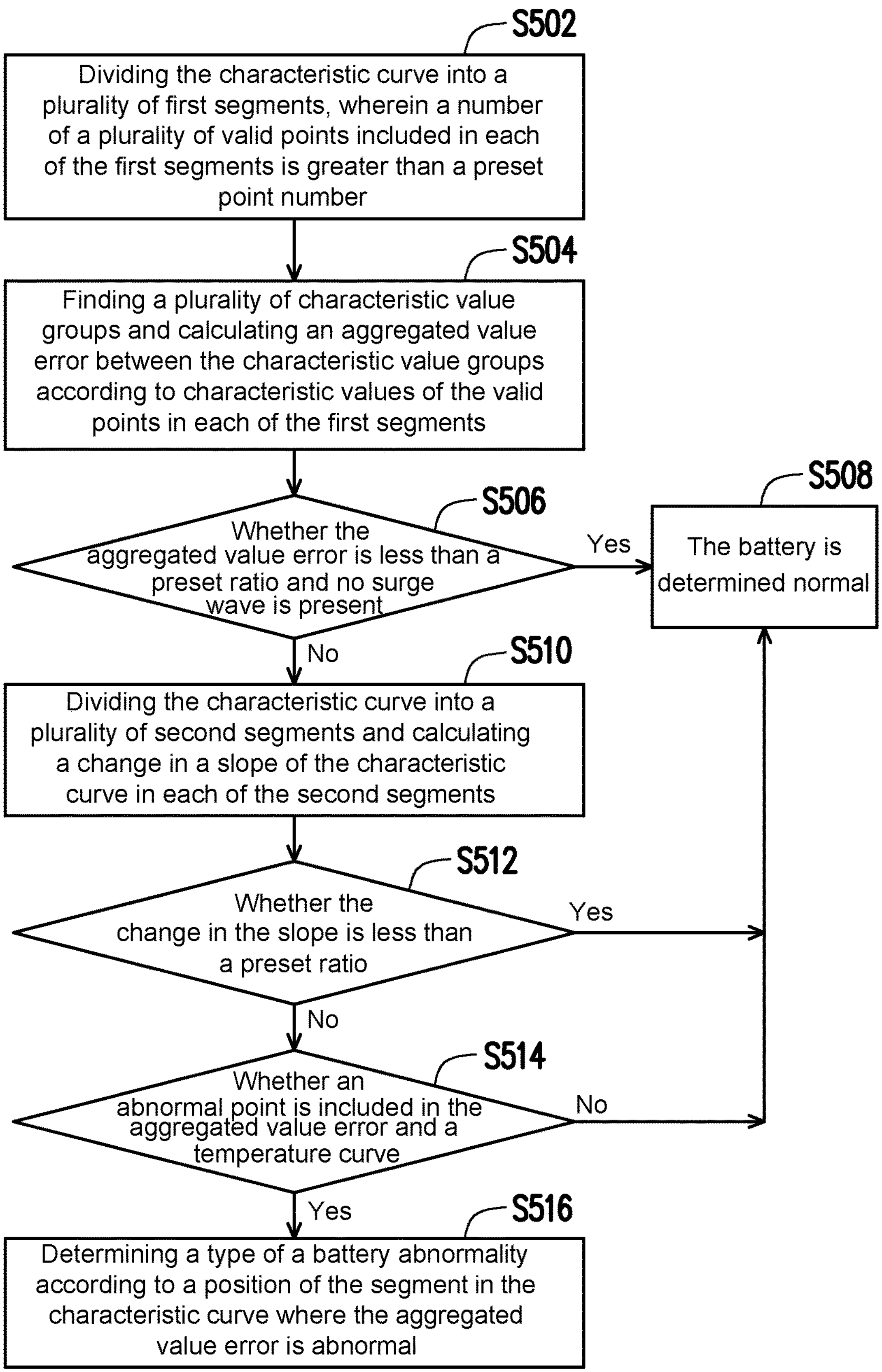
FIG. 5 is a flow diagram of a method of a step-curvature radius analysis according to an embodiment of the disclosure.

FIG. 5 is a flow diagram of a method of a step-curvature radius analysis according to an embodiment of the disclosure. Please refer to FIG. 1, FIG. 2, and FIG. 5 at the same time. The embodiment further illustrates the implementation of the step-curvature radius analysis described in step S210 of FIG. 2. The steps are as follows.

In step S502, the processor 14 divides the characteristic curve into multiple first segments. The number of multiple valid points included in each first segment is greater than a preset number (e.g., 5 or other positive integers). In step S504, the processor 14 finds multiple characteristic value groups according to the characteristic value of each segment, and calculates the aggregated value error between the characteristic value groups. The steps S502 to S504 above are the same as or similar to the steps S402 to S404 of the foregoing embodiment, and thus the detailed description thereof is omitted herein.

Different from the foregoing embodiments, in step S506 of the embodiment, the processor 14 determines whether the aggregated value error of the different segments is less than a preset ratio, and determines that there is no surge wave in each first segment. The preset ratio is, for example, 1% or any other ratio, and there is no limitation here. The surge wave is determined by, for example, calculating the curvature change of each first segment and comparing with the average curvature of the characteristic curve to determine whether there is a surge wave in each first segment.

When it is determined that the aggregated value error is less than the preset ratio and there is no surge wave, then in step S508, the processor 14 determines that the battery 20 is normal. When it is determined that the aggregated value error is not less than the preset ratio or there is a surge wave, then in step S510, the processor 14 divides the characteristic curve into multiple second segments. The length of the second segment is less than the length of the first segment. In step S512, it is determined whether a change in slope of the characteristic curve in each second segment is less than the preset ratio.

Specifically, by dividing the characteristic curve into multiple first segments for preliminary analysis in step S506, the processor 14 performs detailed analysis by dividing the characteristic curve into multiple second segments with shorter lengths in step S512, which may increase the accuracy of detection while reducing the amount of calculation.

In step S512, when it is determined that the change in slope of each second segment of the characteristic curve is less than a preset ratio, the processor 14 may determine that the battery is normal. When it is determined that the change in slope of each second segment of the characteristic curve is not less than the preset ratio, then in step S514, the processor 14 further determines whether the aggregated value error and the temperature curve include abnormal points.

The processor 14, for example, captures the temperature value of the battery 20 during operation via the data capturing device 12 to form a temperature curve, and divides the temperature curve into multiple segments to calculate the curvature change, and determines whether the abnormal points are included in the temperature curve according to the calculated temperature curve. In addition, the processor 14 also calculates the ratio of the sum of the aggregated value errors of all segments of the characteristic curve to the average curvature of the characteristic curve to determine whether the characteristic curve is abnormal. When there is no abnormality in the characteristic curve or no abnormal point in the temperature curve, in step S508, the processor 14 still determines that the battery 20 is normal.

When the characteristic curve is abnormal and the temperature curve has the abnormal points, that is, the processor 14 determines that the battery 20 is abnormal, in step S516, the processor 14 determines the type of the battery abnormality according to the position of the segment in the characteristic curve where the aggregated value error is abnormal. For example, when the abnormal segment is in the first half of the characteristic curve, the processor 14 may determine that the electrode of the battery 20 is abnormal. When the abnormal segment is in the second half of the characteristic curve, the processor 14 may determine that the interface (i.e., the ionosphere) of the battery 20 is abnormal.

In some embodiments, when determining whether the aggregated value error and the temperature curve include the abnormal points, the processor 14, for example, uses different weights to measure the weights of the two factors on the determination result. For example, the processor 14 uses the abnormality of the characteristic curve as the main factor and the abnormality of the temperature curve as the secondary factor. The determination result of whether the characteristic curve is abnormal and the determination result of whether the temperature curve is abnormal, respectively, are multiplied by the corresponding weight and then added. After the weights are added together, the processor 14 determines whether the battery 20 is normal according to the calculation result. The weight ratio between whether the characteristic curve is abnormal and whether the temperature curve is abnormal is, for example, 4:1 or other ratios, and there is no limitation here. In this way, the battery detection device 10 may determine more accurately by taking into account the temperature abnormality while detecting the abnormality of the battery electrical performance.

To sum up, the method and the device for battery detection according to the embodiments of the disclosure may effectively detect the battery abnormality according to the curvature change of the charging or discharging curve of the battery through combining curve fitting, polynomial fitting, wave peak fitting, and other technologies. Using the technology of the step-curvature radius analysis, the characteristic curve is divided into segments with different lengths for analysis, which may decrease the amount of calculation while increasing the accuracy in detecting battery abnormality.

Although the disclosure has been described with reference to the foregoing embodiments, the embodiments are not intended to limit the disclosure. Any person skilled in the art may make some changes and modifications without departing from the spirit and scope of the disclosure. Therefore, the scope of the disclosure will be defined in the appended claims.

What is claimed is:

1. A method for battery detection, adapted to an electronic device comprising a data capturing device and a processor, comprising:

measuring, by a sensor, a plurality of characteristic values of a battery during an operation of the battery;

capturing the plurality of characteristic values measured from a battery during the operation of the battery via the data capturing device to form a characteristic curve;

performing a curve fitting on the characteristic curve to obtain a curve error;

determining whether a magnitude of the curve error is greater than or equal to a threshold value;

performing a step-curvature radius analysis on the characteristic curve to determine whether the battery is normal in response to determining that the magnitude of the curve error is greater than or equal to the threshold value, wherein performing the step-curvature radius analysis on the characteristic curve comprises:

dividing the characteristic curve into a plurality of first segments, wherein a number of a plurality of valid points included in each of the first segments is greater than a preset number;

finding a plurality of characteristic value groups and calculating an aggregated value error between the characteristic value groups according to the characteristic values of the valid points in each of the first segments, so as to determine whether the characteristic value groups are centralized; and determining a type of a battery abnormality according to a position of a segment in the characteristic curve where the aggregated value error is abnormal when the battery is determined to be abnormal, wherein determining the type of the battery abnormality comprises:

determining that an electrode of the battery is abnormal when the segment is in a first half of the characteristic curve, and determining that an interface of the battery is abnormal when the segment is in a second half of the characteristic curve, thereby providing a specific, physically-anchored diagnosis for a battery management system.

2. The method for battery detection according to claim 1, wherein performing the curve fitting on the characteristic curve comprises:

performing a polynomial fitting on the characteristic curve and adjusting a polynomial power, so that a function curve constructed by an adjusted polynomial function fits the characteristic curve;

determining whether the polynomial power of the adjusted polynomial function is less than a preset power; and performing the step-curvature radius analysis on the characteristic curve when the polynomial power is less than the preset power.

3. The method for battery detection according to claim 2, wherein performing the curve fitting on the characteristic curve comprises:

calculating a full-range curve error of the characteristic curve and determining whether a ratio of the full-range curve error to an average curvature of the characteristic curve is less than a preset ratio;

determining that the battery is normal when the ratio is less than the preset ratio; and performing the polynomial fitting on the plurality of the characteristic values when the ratio is not less than the preset ratio.

4. The method for battery detection according to claim 2, wherein performing the curve fitting on the characteristic curve comprises:

performing a peak fitting on the characteristic curve using at least one peak function to find at least one surge wave in the characteristic curve that conforms to the at least one peak function;

determining whether a number of the at least one surge wave found is less than a preset surge wave number; and performing the step-curvature radius analysis on the characteristic curve when the number is less than the preset surge wave number.

5. The method for battery detection according to claim 3, wherein performing the curve fitting on the characteristic curve further comprises:

constructing a natural function curve using a natural function when the polynomial power is determined to be not less than the preset power and a number is not less than a preset surge wave number;

confirming whether the natural function curve is included in the characteristic curve; and performing the step-curvature radius analysis on the characteristic curve when the natural function curve is not included in the characteristic curve.

6. The method for battery detection according to claim 1, wherein performing the step-curvature radius analysis on the characteristic curve further comprises:

dividing the characteristic curve into a plurality of second segments when the characteristic value groups are determined to be centralized, wherein a length of a second segment is less than a length of a first segment;

determining whether a change in a slope of the characteristic curve in each of the second segments is less than a preset ratio; and determining whether the battery is normal according to the aggregated value error of the characteristic value groups when the change in the slope is not less than the preset ratio.

7. The method for battery detection according to claim 1, wherein performing the step-curvature radius analysis on the characteristic curve further comprises:

determining whether the battery is normal according to the aggregated value error of the characteristic value groups and whether an abnormal point is included in a temperature curve of the battery when a change in a slope is not less than a preset ratio.

8. The method for battery detection according to claim 1, wherein performing the step-curvature radius analysis on the characteristic curve further comprises:

determining whether a surge wave is included according to a change in a slope of the characteristic curve of each of the first segments; and determining whether the battery is normal according to the aggregated value error of the characteristic value groups when the characteristic value groups are determined to be centralized and the characteristic curve comprises the surge wave.

9. A device for battery detection, comprising:

data capturing device;

a sensor configured to measuring a plurality of characteristic values of a battery during an operation of the battery; and a processor, coupled to the data capturing device and the sensor, configured to:

capture the plurality of characteristic values measured from a battery during the operation of the battery via the data capturing device to form a characteristic curve;

perform a curve fitting on the characteristic curve to obtain a curve error;

determine whether a magnitude of the curve error is greater than or equal to a threshold value;

perform a step-curvature radius analysis on the characteristic curve to determine whether the battery is normal in response to determining that the magnitude of the curve error is greater than or equal to the threshold value, wherein performing the step-curvature radius analysis on the characteristic curve comprises:

dividing the characteristic curve into a plurality of first segments, wherein a number of a plurality of valid points included in each of the first segments is greater than a preset number;

finding a plurality of characteristic value groups and calculating an aggregated value error between the characteristic value groups according to the characteristic values of the valid points in each of the first segments, so as to determine whether the characteristic value groups are centralized; and determining a type of a battery abnormality according to a position of a segment in the characteristic curve where the aggregated value error is abnormal when the battery is determined to be abnormal, wherein determining the type of the battery abnormality comprises:

determining that an electrode of the battery is abnormal when the segment is in a first half of the characteristic curve, and determining that an interface of the battery is abnormal when the segment is in a second half of the characteristic curve, thereby providing a specific, physically-anchored diagnosis for a battery management system.

10. The device for battery detection according to claim 9, wherein the processor comprises:

performing a polynomial fitting on the characteristic curve and adjusting a polynomial power, so that a function curve constructed by an adjusted polynomial function fits the characteristic curve;

determining whether the polynomial power of the adjusted polynomial function is less than a preset power; and performing the step-curvature radius analysis on the characteristic curve when the polynomial power is less than the preset power.

11. The device for battery detection according to claim 10, wherein the processor comprises:

calculating a full-range curve error of the characteristic curve and determining whether a ratio of the full-range curve error to an average curvature of the characteristic curve is less than a preset ratio;

determining that the battery is normal when the ratio is less than the preset ratio; and performing the polynomial fitting on the plurality of the characteristic values when the ratio is not less than the preset ratio.

12. The device for battery detection according to claim 10, wherein the processor comprises:

performing a peak fitting on the characteristic curve using at least one peak function to find at least one surge wave in the characteristic curve that conforms to the at least one peak function;

determining whether a number of the at least one surge wave found is less than a preset surge wave number; and performing the step-curvature radius analysis on the characteristic curve when the number is less than the preset surge wave number.

13. The device for battery detection according to claim 11, wherein the processor comprises:

constructing a natural function curve using a natural function when the polynomial power is determined to be not less than the preset power and a number is not less than a preset surge wave number;

confirming whether the natural function curve is included in the characteristic curve; and performing the step-curvature radius analysis on the characteristic curve when the natural function curve is not included in the characteristic curve.

14. The device for battery detection according to claim 9, wherein the processor comprises:

dividing the characteristic curve into a plurality of second segments when the characteristic value groups are determined to be centralized, wherein a length of a second segment is less than a length of a first segment;

determining whether a change in a slope of the characteristic curve in each of the second segments is less than a preset ratio; and determining whether the battery is normal according to the aggregated value error of the characteristic value groups when the change in the slope is not less than the preset ratio.

15. The device for battery detection according to claim 9, wherein the processor further comprises:

determining whether the battery is normal according to the aggregated value error of the characteristic value groups and whether an abnormal point is included in a temperature curve of the battery when a change in a slope is not less than a preset ratio.

16. The device for battery detection according to claim 9, wherein the processor further comprises:

determining whether a surge wave is included according to a change in a slope of the characteristic curve of each of the first segments; and determining whether the battery is normal according to the aggregated value error of the characteristic value groups when the characteristic value groups are determined to be centralized and the characteristic curve comprises the surge wave.

* * * * *